United States Patent
Suzuki et al.

(10) Patent No.: US 6,924,043 B2
(45) Date of Patent: Aug. 2, 2005

(54) ULTRA-THIN COPPER FOIL WITH CARRIER, METHOD OF PRODUCTION OF SAME, AND PRINTED CIRCUIT BOARD USING ULTRA-THIN COPPER FOIL WITH CARRIER

(75) Inventors: Yuuji Suzuki, Tochigi (JP); Akira Matsuda, Tochigi (JP)

(73) Assignee: Furkawa Circuit Foil Co., Ltd., Tokyo (JP)

( * ) Notice: Subject to any disclaimer, the term of this patent is extended or adjusted under 35 U.S.C. 154(b) by 0 days.

(21) Appl. No.: 10/698,014

(22) Filed: Oct. 31, 2003

(65) Prior Publication Data

US 2004/0121178 A1 Jun. 24, 2004

(30) Foreign Application Priority Data

Oct. 31, 2002 (JP) ........................................ 2002-317907

(51) Int. Cl.[7] .............................................. B32B 15/00
(52) U.S. Cl. ........................ 428/615; 428/612; 428/618; 428/655; 428/660
(58) Field of Search ................................ 428/548, 615, 428/617, 618, 612, 655, 660

(56) References Cited

U.S. PATENT DOCUMENTS

| | | | |
|---|---|---|---|
| 4,568,413 A | * | 2/1986 | Toth et al. .................. 156/151 |
| 5,066,366 A | * | 11/1991 | Lin .............................. 205/76 |
| 5,262,247 A | | 11/1993 | Kajiwara et al. |
| 5,689,879 A | | 11/1997 | Urasaki et al. |
| 5,709,957 A | * | 1/1998 | Chiang et al. .............. 428/615 |
| 6,346,335 B1 | * | 2/2002 | Chen et al. ................. 428/629 |
| 6,660,406 B2 | * | 12/2003 | Yamamoto et al. ......... 428/615 |

FOREIGN PATENT DOCUMENTS

| | | |
|---|---|---|
| EP | 1 133 220 A2 | 9/2001 |
| EP | 1 331 088 A1 | 7/2003 |

* cited by examiner

*Primary Examiner*—Cathy F. Lam
(74) *Attorney, Agent, or Firm*—Arent Fox PLLC

(57) ABSTRACT

An ultra-thin copper foil with a carrier having a peeling layer able to withstand even high temperature working in the case of using a high heat resistant resin, enabling the carrier foil and the ultra-thin copper foil to be easily peeled apart, and reduced in the number of pinholes by uniform plating without impairing the peelability of the peeling layer, that is, an ultra-thin copper foil with a carrier comprised of a carrier foil, a peeling layer, and an ultra-thin copper foil, wherein the peeling layer and the ultra-thin copper foil are provided between them with a strike plating layer at the surface on the peeling layer side, an ultra-thin layer of copper is provided on this according to need, and an ultra-thin copper foil comprised of copper or a copper alloy or a phosphorus-containing copper or phosphorus-containing copper alloy is provided. The peeling layer between the carrier foil and the ultra-thin copper foil is chromium, a chromium alloy, a chromium-containing oxide hydrate layer, nickel, iron, or an alloy layer of the same or an oxide hydrate layer of the same.

21 Claims, 4 Drawing Sheets

ULTRA-THIN COPPER FOIL WITH CARRIER, METHOD OF PRODUCTION OF SAME, AND PRINTED CIRCUIT BOARD USING ULTRA-THIN COPPER FOIL WITH CARRIER

BACKGROUND OF THE INVENTION

1. Field of the Invention

The present invention relates to an ultra-thin copper foil with a carrier and a method of production of an ultra-thin copper foil with a carrier, more particularly relates to an ultra-thin copper foil with a carrier suitable for a printed circuit board for high density ultrafine interconnect (fine pattern) applications.

2. Description of the Related Art

A printed circuit board is produced as follows: First, an electrically insulating board comprised of a glass-epoxy resin, a glass polyimide resin, etc. is covered on its surface by a thin copper foil for formation of surface patterns, then the two are heated and pressed to produce a copper-clad laminate.

Next, this copper-clad laminate is successively formed with through holes and plated at the through holes, then the copper foil at the surface of the copper-clad laminate is etched to form interconnect patterns of the desired line widths and line pitches. Finally, a solder resist is formed and other finishing work is performed.

The copper foil used for the copper-clad laminate is roughened at its surface at the side to be hot bonded to the board, exhibits an anchoring effect on the board by the roughened surface, and thereby raises the bond strength between the board and copper foil to secure reliability in the printed circuit board. Further, recently, a printed circuit board, in particular a build-up circuit board has been made by using a resin coated copper foil whose roughened surface is covered in advance by a bonding resin such as an epoxy resin which is made to an insulating resin layer in the semicured state (B stage) as the copper foil for forming the surface circuits, when the insulating resin layer side is hot bonded to a board. A "build-up circuit board" is a type of multilayer circuit board obtained by forming an insulating layer and conductor patterns one by one in turn on an insulating board, plating holes (vias) formed by a laser method or photolithography, and stacking the interconnect layers while connecting the layers conductively.

This circuit board can handle the increasingly higher densities of various electronic parts. By making the vias increasingly fine, the interconnect patterns can also be made higher in density. Therefore, there is a demand for a printed circuit board with interconnect patterns enabling interconnects of fine line widths and line pitches, that is, fine patterns. For example, in the case of printed circuit boards used for semiconductor packages, a printed circuit board having high density ultrafine interconnects of line widths and line pitches of around 30 $\mu$m has been demanded.

If a thick copper foil as the copper foil for forming such a fine printed circuit board is used, the etching time until reaching the surface of the board becomes longer. As a result, the verticality of the side walls of the interconnect patterns formed is ruined. In the case of interconnect patterns with narrow line widths of interconnects in the interconnect patterns formed, sometimes this leads to disconnects. Therefore, as the copper foil used for fine pattern applications, copper foil having a thickness of less than 9 $\mu$m, in particular less than 5 $\mu$m due to the increase in the number of circuits due to the increase in the volume of information, is being used.

However, a thin copper foil (ultra-thin copper foil) is low in mechanical strength, easily wrinkles, is creased, and sometimes tears when producing a printed circuit board, so as the ultra-thin copper foil used for fine pattern applications, an ultra-thin copper foil with a carrier obtained by directly electrodepositing an ultra-thin copper foil layer on one surface of a carrier copper foil through a peeling layer is being used.

The ultra-thin copper foil with a carrier, as shown in FIG. 4, is formed with a foil 1 serving as the carrier (hereinafter called the "carrier foil") and a peeling layer 2 and electroplated copper layer 3 successively formed on one surface of the same. The surface of the outermost layer of the electroplated copper layer 3 is roughened. Further, the roughened surface is superposed with a glass epoxy board, the two are hot bonded, then the carrier foil 1 is peeled off via the peeling layer 2 to expose the bonding side of the electroplated copper layer 3 with the peeling layer 2, and the electroplated copper layer 3 is formed with predetermined interconnect patterns.

The carrier foil 1 functions as a reinforcing material (carrier) backing up the electroplated copper layer 3 until bonding the thin electroplated copper layer 3 with the board. Further, the peeling layer 2 is a layer for improving the peeling when separating the electroplated copper layer 3 and the carrier foil 1 and is removed together with the carrier foil 1 when peeling off the carrier foil 1, so it is possible to cleanly and easily peel off the carrier foil 1. On the other hand, the electroplated copper layer 3 bonded with the glass epoxy board is successively formed with through holes and plated at the through holes, then the copper foil at the surface of the copper-clad laminate is etched to form interconnect patterns with the desired line widths and line pitches. Finally, a solder resist is formed and other finishing work performed.

In this way, the copper foil with a carrier can be used to produce a build-up circuit board since the thickness of the electroplating layer 3 can be made an ultra-thin one of for example 9 $\mu$m or less, fine patterns can be formed, and the handling ability is superior.

As the copper foil with a carrier, a composite foil providing a carrier foil with a chromate thin peeling layer, providing the peeling layer with a copper layer by an alkaline copper pyrophosphate bath, and providing this with a further copper layer has been proposed (for example, see Japanese Examined Patent Publication (Kokoku) No. 61-34385).

When applying the composite foil to a heat resistant glass epoxy resin laminate such as the FR-4 grade, the hot bonding temperature is around 170° C., so the copper foil and carrier foil can be peeled apart, but the peel strength depends on the surface roughness of the carrier copper foil and the peel strength lacks stability. Further, when a heat resistant resin, in particular a polyimide resin, is used as a board, the working temperature becomes a high temperature of 300° C. or more both in the case of the casting method and hot bonding method, so diffusion of copper due to the temperature becomes great, the surface roughness of the carrier copper foil further affects the peel strength, the stability of the peel strength of the carrier foil and ultra-thin copper foil is lost, and the variation in the peel strength also becomes large. Further, since it is difficult to uniformly plate an ultra-thin copper foil on a peeling layer, the number of pinholes present in the ultra-thin copper foil becomes greater (for example, see Comparative Examples 5 to 6 of Japanese Examined Patent Publication (Kokoku) No. 08-18401).

SUMMARY OF THE INVENTION

An object of the present invention is to provide an ultra-thin copper foil with a carrier having a peeling layer able to withstand even high temperature working such as when using a high heat resistant resin, enabling the carrier foil and the ultra-thin copper foil to be easily peeled apart by a stable peel strength by keeping to a minimum the effects of roughness of the carrier foil, and reduced in the number of pinholes even with an ultra-thin copper foil of a thickness of 10 $\mu$m or less by uniformly plating copper foil on the carrier foil, a method of production of the same, and a printed circuit board using this ultra-thin copper foil with a carrier.

According to a first aspect of the present invention, there is provided an ultra-thin copper foil with a carrier comprised of a carrier foil, a peeling layer, and an ultra-thin copper foil, wherein the ultra-thin copper foil and the peeling layer are provided between them with a strike plating layer and wherein the ultra-thin copper foil and the strike plating layer are one of a phosphorus-containing copper layer and a phosphorus-containing copper alloy layer.

According to a second aspect of the present invention, there is provided an ultra-thin copper foil with a carrier comprised of a carrier foil, a peeling layer, and an ultra-thin copper foil, wherein the ultra-thin copper foil and the peeling layer are provided between them with a strike plating layer comprised of one of a phosphorus-containing copper layer and a phosphorus-containing copper alloy layer, the strike plating layer is provided on it with a copper plating ultra-thin layer, and the ultra-thin layer is provided on it with the ultra-thin copper foil comprised of one of copper and a copper alloy.

According to a third aspect of the present invention, there is provided an ultra-thin copper foil with a carrier comprised of a carrier foil, a peeling layer, and an ultra-thin copper foil, wherein the ultra-thin copper foil and the peeling layer are provided between them with a strike plating layer comprised of one of a phosphorus-containing copper layer and a phosphorus-containing copper alloy layer, the strike plating layer is provided on it with a copper plating ultra-thin layer, and the ultra-thin layer is provided on it with the ultra-thin copper foil comprised of one of a phosphorus-containing copper layer and a phosphorus-containing copper alloy layer.

According to a fourth aspect of the present invention, there is provided an ultra-thin copper foil with a carrier comprised of a carrier foil, a peeling layer, and an ultra-thin copper foil, wherein the ultra-thin copper foil and the peeling layer are provided between them with a strike plating layer comprised of one of a phosphorus-containing copper layer and a phosphorus-containing copper alloy layer, the strike plating layer is provided on it with an ultra-thin layer comprised of one of a phosphorus-containing copper layer and phosphorus-containing copper alloy layer, and the ultra-thin layer is provided on it with the ultra-thin copper foil comprised of one of copper and a copper alloy.

According to a fifth aspect of the present invention, there is provided an ultra-thin copper foil with a carrier comprised of a carrier foil, a peeling layer, and an ultra-thin copper foil, wherein the ultra-thin copper foil and the peeling layer are provided between them with a strike plating layer comprised of one of a phosphorus-containing copper layer and a phosphorus-containing copper alloy layer, the strike plating layer is provided on it with an ultra-thin layer comprised of one of a phosphorus-containing copper layer and phosphorus-containing copper alloy layer, and the ultra-thin layer is provided on it with the ultra-thin copper foil comprised of one of a phosphorus-containing copper and a phosphorus-containing copper alloy.

According to a sixth aspect of the present invention, there is provided an ultra-thin copper foil with a carrier comprised of a carrier foil, a peeling layer, and an ultra-thin copper foil, wherein a surface roughness Rz of a surface of the carrier foil on the ultra-thin copper foil side is 0.1 $\mu$m to 5 $\mu$m, a surface roughness Rz of a carrier foil side of the ultra-thin copper foil provided on the peeling layer provided on the carrier foil surface is 0.1 $\mu$m to 5 $\mu$m, one of a copper and copper alloy layer covering at least 90% of the area of the surface of the peeling layer is formed at a position of the surface roughness Rz of the ultra-thin copper foil plus 0.1 $\mu$m to 0.2 $\mu$m at the ultra-thin copper foil side from the projections of the surface relief of the carrier foil side of the ultra-thin copper foil, and a peel strength after hot bonding of at least 300° C. is 0.01 KN/m to 0.05 KN/m.

According to a seventh aspect of the present invention, there is provided an ultra-thin copper foil with a carrier comprised of a carrier foil, a peeling layer, and an ultra-thin copper foil, wherein a surface roughness Rz of a surface of the carrier foil on the ultra-thin copper foil side is 0.1 $\mu$m to 5 $\mu$m, a surface roughness Rz of a carrier foil side of the ultra-thin copper foil provided on the peeling layer provided on the carrier foil surface is 0.1 $\mu$m to 5 $\mu$m, one of a copper and copper alloy layer having a conductivity of at least 90% is formed at a position of the surface roughness Rz of the ultra-thin copper foil plus 0.1 $\mu$m to 0.2 $\mu$m at the ultra-thin copper foil side from the projections of the surface relief on the carrier foil side of the ultra-thin copper foil, and a peel strength after hot bonding of at least 300° C. is 0.01 KN/m to 0.05 KN/m.

According to an eighth aspect of the present invention, there is provided a method of production of an ultra-thin copper foil with a carrier comprised of a carrier foil, a peeling layer, and an ultra-thin copper foil including plating the surface of the carrier foil with one of chromium, nickel, iron, and an alloy of the same to form a peeling layer, forming on the peeling layer one of a phosphorus-containing copper layer and a phosphorus-containing copper alloy layer by strike plating in one of a phosphorus-containing copper and a phosphorus-containing copper alloy plating bath, and forming on it by plating an ultra-thin copper foil comprised of one of a phosphorus-containing copper and a phosphorus-containing copper alloy.

According to a ninth aspect of the present invention, there is provided a method of production of an ultra-thin copper foil with a carrier comprised of a carrier foil, a peeling layer, and an ultra-thin copper foil including plating the surface of the carrier foil with one of chromium, nickel, iron, and an alloy of the same to form a peeling layer, strike plating the peeling layer with one of a phosphorus-containing copper layer and a phosphorus-containing copper alloy layer in one of a phosphorus-containing copper and a phosphorus-containing copper alloy plating bath, forming on the strike plating layer an ultra-thin layer by one of a copper and a copper alloy plating, and forming on the ultra-thin layer an ultra-thin copper foil by one of a copper and a copper alloy plating.

According to a 10th aspect of the present invention, there is provided a method of production of an ultra-thin copper foil with a carrier comprised of a carrier foil, a peeling layer, and an ultra-thin copper foil including plating the surface of the carrier foil with one of chromium, nickel, iron, and an alloy of the same to form a peeling layer, strike plating the peeling layer with one of a phosphorus-containing copper layer and a phosphorus-containing copper alloy layer by strike plating in one of a phosphorus-containing copper and a phosphorus-containing copper alloy plating bath, forming on the strike plating layer an ultra-thin layer by one of a copper and a copper alloy plating, and forming on the ultra-thin layer an ultra-thin copper foil by one of a phosphorus-containing copper and a phosphorus-containing copper alloy plating.

According to an 11th aspect of the present invention, there is provided a method of production of an ultra-thin copper foil with a carrier comprised of a carrier foil, a peeling layer, and an ultra-thin copper foil including plating the surface of the carrier foil with one of chromium, nickel, iron, and an alloy of the same to form a peeling layer, strike plating the peeling layer with one of a phosphorus-containing copper layer and a phosphorus-containing copper alloy layer by strike plating in one of a phosphorus-containing copper and a phosphorus-containing copper alloy plating bath, forming on the strike plating layer an ultra-thin layer comprised of one of a phosphorus-containing copper and a phosphorus-containing copper alloy, and forming on the ultra-thin layer an ultra-thin copper foil by one of a copper and a copper alloy plating.

According to a 12th aspect of the present invention, there is provided a method of production of an ultra-thin copper foil with a carrier comprised of a carrier foil, a peeling layer, and an ultra-thin copper foil including plating the surface of the carrier foil with one of chromium, nickel, iron, and an alloy of the same to form a peeling layer, strike plating the peeling layer with one of a phosphorus-containing copper layer and a phosphorus-containing copper alloy layer by strike plating in one of a phosphorus-containing copper and a phosphorus-containing copper alloy plating bath, forming on the strike plating layer an ultra-thin layer comprised of one of a phosphorus-containing copper and a phosphorus-containing copper alloy, and forming on the ultra-thin layer an ultra-thin copper foil by one of a phosphorus-containing copper and a phosphorus-containing copper alloy plating.

According to a 13th aspect of the present invention, there is provided a method of production of an ultra-thin copper foil with a carrier comprised of a carrier foil, a peeling layer, and an ultra-thin copper foil including forming on the surface of the carrier foil having a surface roughness Rz of 0.1 $\mu$m to 5 $\mu$m a peeling layer, forming on the peeling layer an ultra-thin copper foil to give a surface roughness Rz of a carrier foil side of 0.1 $\mu$m to 5 $\mu$m, forming a strike plating layer by one of a pH3 to pH13 phosphorus-containing/not containing copper and phosphorus-containing/not containing copper alloy plating bath so that at least 90% of the area of the peeling layer surface is covered by a copper layer at a position of the surface roughness Rz of the ultra-thin copper foil plus 0.1 $\mu$m to 0.2 $\mu$m at the ultra-thin copper foil side from the projections of the surface relief on the carrier foil side of the ultra-thin copper foil, and forming on the strike plating layer one of a phosphorus-containing/not containing copper and copper alloy layer as the ultra-thin copper foil of a predetermined thickness.

According to a 14th aspect of the present invention, there is provided a method of production of an ultra-thin copper foil with a carrier comprised of a carrier foil, a peeling layer, and an ultra-thin copper foil including forming on the surface of the carrier foil having a surface roughness Rz of 0.1 $\mu$m to 5 $\mu$m a peeling layer, forming on the peeling layer an ultra-thin copper foil to give a surface roughness Rz of a carrier foil side of 0.1 $\mu$m to 5 $\mu$m, forming a strike plating layer by one of a pH3 to pH13 phosphorus-containing/not containing copper and phosphorus-containing/not containing copper alloy plating bath so as to give a copper layer having a conductivity of at least 90% at a position of the surface roughness Rz of the ultra-thin copper foil plus 0.1 $\mu$m to 0.2 $\mu$m at the ultra-thin copper foil side from the projections of the surface relief on the carrier foil side of the ultra-thin copper foil, and forming on the strike plating layer one of a phosphorus-containing/not containing copper and copper alloy layer as the ultra-thin copper foil of a predetermined thickness.

Further, according to the present invention, there is provided a printed circuit board formed with high density ultrafine interconnects using the above ultra-thin copper foil with a carrier.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Figure 1:
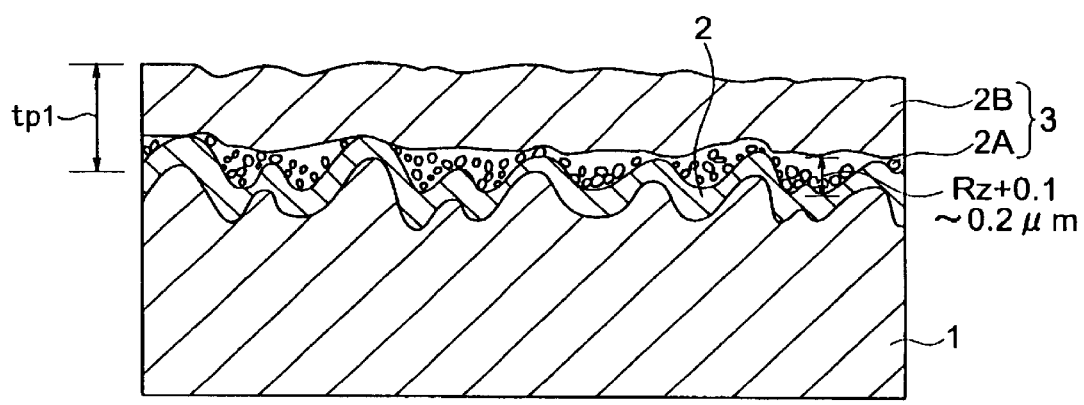
FIG. 1 is a cross-sectional view of an example of the structure of a copper foil with a carrier.

Preferred embodiments of the present invention will be described in detail below while referring to the attached figures.

The carrier foil used in the present invention may be aluminum foil, aluminum alloy foil, stainless steel foil, iron alloy foil, titanium foil, titanium alloy foil, copper foil, copper alloy foil, etc., but from the viewpoint of the cost, electroplated copper foil, electroplated copper alloy foil, rolled copper foil, rolled copper alloy foil, etc. are preferable. Further, it is preferable to use foil of a thickness of 7 to 200 $\mu$m. If using a thin copper foil as the carrier foil, the mechanical strength is low, wrinkles or creases result at the time of production of a printed circuit board, and there is a risk of the copper foil tearing, so it becomes difficult for foil of a thickness of less than 7 $\mu$m to function as a carrier foil. Further, if the thickness of the carrier foil is more than 200 $\mu$m, the weight per unit coil of the product (coil unit weight) rises and has a great effect on the productivity. Further, a larger tension is required in the facilities and the facilities become large in size.

The peeling layer provided on the carrier foil is preferably chromium metal, a chromium alloy, a chromium alloy layer on which is provided a chromium oxide hydrate, a chromium oxide hydrate layer, nickel, iron, or an alloy layer of the same, and/or hydrate layers of the same. As the chromium alloy, nickel-chromium, cobalt-chromium, chromium-tungsten, chromium-copper, chromium-iron, etc. may be mentioned.

As the three-way alloy, nickel-cobalt-chromium, nickel-iron-chromium, nickel-chromium-molybdenum, nickel-chromium-tungsten, nickel-chromium-copper, nickel-chromium-phosphorus, cobalt-iron-chromium, cobalt-chromium-molybdenum, cobalt-chromium-tungsten, cobalt-chromium-copper, cobalt-chromium-phosphorus, etc. may be mentioned. The metals forming these peeling layers and the oxide hydrates of the same are preferably formed by electrotreatment. Note that it sufficient to use nickel, iron, or an alloy layer of the same as the underlayer of the peeling layer in stabilizing the peelability after hot pressing by a higher temperature.

The peel strength of peeling off the ultra-thin copper foil from the carrier foil is affected by the amount of deposition of the metal forming the peeling layer. That is, if the amount of plating deposition is large, the metal forming the peeling layer (hereinafter simply called the "peeling material metal") completely covers the surface of the carrier foil. The peel strength becomes a force separating the bond between the surface of the peeling material metal and the metal foil deposited after this. As opposed to this, if the amount of deposition of the peeling material metal is small, the surface of the carrier foil will not be covered completely by the peeling material metal and the peel strength will become a force separating the bonding force between the metal of the slightly exposed carrier foil and peeling material metal and the metal deposited over them. Therefore, the peel strength of the carrier changes depending on the amount of deposition of the peeling material metal forming the peeling layer, but if the peeling layer is formed (deposited) thick enough to a certain extent, there is no longer any change over that. According to experiments, the peel strength with the foil will no longer change even if increasing the amount of deposition to more than 0.01 to 100 mg/dm$^2$ as the amount of deposition of the metal forming the peeling layer. However, the chromium metal of the metal forming the peeling layer is preferably not more than 4.5 mg/dm$^2$ considering the environmental impact.

Even when the peeling layer is formed by only a metal (or alloy), high temperature peeling can be maintained as explained above. If there is an oxide hydrate present at the surface of the metal, the peelability is further improved. The dipping time in the plating solution, the current value, the wetting of the plating solution, the state of rinsing, the pH of the plating solution right after plating, etc. are closely related to the oxide hydrate formed on the surface layer. This oxide hydrate layer is believed to have a great influence on the high temperature peelability. However, at this time as well, the chromium metal of the metal forming the peeling layer is preferably not more than 4.5 mg/dm$^2$ considering the environmental impact. Further, if over this, the number of pinholes becomes greater. When forming the peeling layer by an oxide hydrate of chromium, the amount of deposition of the chromium metal (including alloys) is preferably not more than 0.015 mg/dm$^2$ considering the environmental impact.

In general, when plating an ultra-thin copper foil on a peeling layer, it is extremely difficult to plate it uniformly due to the peelability of the peeling layer. The number of pinholes in the ultra-thin copper foil becomes greater. Therefore, in the present invention, the peeling layer is strike plated by pyrophosphoric acid or strike plated by a plating solution forming complex ions. By strike plating on the peeling layer, it is possible to plate the peeling layer with a uniform ultra-thin copper foil and possible to remarkably reduce the number of pinholes even in an ultra-thin copper foil of a thickness of less than 10 μm.

As the composition of the strike plating solution of copper pyrophosphate, the following:

| | |
|---|---|
| $Cu_2P_2O_7 \cdot 3H_2O$: | 5 to 50 g/liter |
| $K_4P_2O_7$: | 50 to 300 g/liter |
| pH: | 8 to 10 | is preferable in that it forms a good plated layer.

As the plating solution for forming complex ions, a copper cyanate-sulfamate plating bath may be mentioned. As an example of a copper cyanate strike plating bath, for example the following:

| | |
|---|---|
| CuCN: | 10 to 50 g/liter |
| KCN: | 20 to 60 g/liter |
| pH: | 11 to 13 | is preferable in that it forms a good plated layer.

As a copper sulfamate strike plating bath, for example the following:

| | |
|---|---|
| $Cu(NH_2SO_3) \cdot 4H_2O$: | 20 to 100 g/liter |
| $NiCl_2 \cdot 6H_2O$ | 10 to 60 g/liter |
| $H_3BO_3$: | 10 to 40 g/liter |
| pH: | 3.5 to 4.5 | is preferable in that it forms a good plated layer.

Further, even if there is variation in the surface roughness of the carrier foil, it is possible to obtain a stable peel strength by strike plating. Further, the formation of a chromate layer as the peeling layer is susceptible to the effects of the surface roughness of the surface of the carrier foil since the film produced is thin. This can become a reason for variation in the peel strength. By strike plating on the peeling surface, however, it is possible to suppress variation in the peel strength. Note that instead of the strike plating on the peeling layer, a similar effect can be obtained by pulse plating. When an organic film is used as a peeling layer, this strike plating is effective for plating on this organic film as well. When forming an ultra-thin copper foil of a thickness of 10 μm or less on the strike plating, there is the effect of reduction of pinholes.

The average plating thickness of the copper layer to be deposited by strike plating is preferably 0.01 μm to 0.5 μm. The plating conditions differ depending on the type of bath, but the current density is preferably 0.1 A/dm$^2$ to 10 A/dm$^2$ and the plating time is preferably about 0.1 second to 2 minutes. With a current density of less than 0.1 A/dm$^2$, it is difficult to uniformly plate the peeling layer. Further, with a current density more than 10 A/dm$^2$, with strike plating reducing the metal concentration of the plating bath, "burned" plating is caused and a uniform copper plating layer cannot be obtained. Further, with a plating time less than 0.1 second, a sufficient plating layer cannot be obtained.

As the method of formation of the strike plating layer, it is possible to first form on the peeling layer a thin copper plating layer having a thickness of 0.01 μm to 0.5 μm in a copper pyrophosphate plating bath so as not to impair the peelability of the peeling layer, then form a fixed film thickness in a plating bath such as a copper sulfate bath with a good current efficiency. In this method as well, as a method of producing a copper foil with a carrier able to be easily peeled off and reduced in number of pinholes, it is possible to strike plate on the peeling layer with copper pyrophosphate to form a uniform copper plating layer, plate on this in a copper pyrophosphate plating bath without invading the copper strike plating layer to form a stable plated layer, then plate on this to the target thickness using a good current efficiency copper sulfate plating bath, copper cyanate plating bath, copper borofluoride plating bath, copper pyrophosphate plating bath, etc. This results in a good quality and is efficient.

It is reported that by using a bath forming complex ions for the plating bath of the ultra-thin copper foil plated on the peeling layer, an effect of reducing the number of pinholes is obtained (see the above Japanese Examined Patent Publication (Kokoku) No. 61-34385). A plating solution forming complex ions is generally not that good in closeness of contact, so it is not possible to uniformly cover the surface of the peeling layer at a position of less than the Rz value +0.2 $\mu$m from the recesses of the surface relief of the peeling surface on the surface of the carrier foil, but strike plating on the peeling layer enables more than 90% coverage of the surface of the peeling layer at a position of the surface roughness Rz of the ultra-thin copper foil plus 0.1 to 0.2 $\mu$m and enables a greater reduction of the number of pinholes and a stabilization of the peelability.

Further, to obtain bondability with the resin provided at the surface of the ultra-thin copper foil, it is possible to roughen the surface of the ultra-thin copper foil to make the surface roughness Rz of the roughened surface 0.2 to 4.0 $\mu$m. That is, roughening does not have that much of an effect on the bondability with a resin and it is therefore meaningless if the roughness is less than 0.2 $\mu$m. If the roughness is 4 $\mu$m, a sufficient bondability is obtained, so more roughening that that is not required. Note that the "surface roughness Rz" means the surface roughness defined in 5.1 "Definition of 10-Point Average Roughness" of JIS B 0601-1994 "Definition and Indication of Surface Roughness".

Next, the present invention will be explained in detail in accordance with examples with reference to the drawings.

EXAMPLE 1 (FIG. 1)

1. Preparation of carrier copper foil: As the carrier copper foil 1, an untreated electroplated copper foil having a thickness of 31 $\mu$m and a shiny surface roughness Rz of 1.5 $\mu$m was prepared.

2. Formation of peeling layer: The shiny surface of the carrier copper foil 1 was then continuously electrotreated to form a metal chromium peeling layer 2 having an amount of deposition of metal chromium of 0.50 mg/dm$^2$.

3. Formation of phosphorus-containing strike plating layer at surface of peeling layer 2 and its vicinity: Next, this peeling layer 2 was strike plated for 30 seconds in a solution of:

| | |
|---|---|
| Cu$_2$P$_2$O$_7$.3H$_2$O: | 30 g/liter |
| K$_4$P$_2$O$_7$: | 300 g/liter |
| pH: | 8 | under conditions of a current density of 1.5 A/dm$^2$ so as to form a phosphorus-containing layer 2A on the surface of the peeling layer and its vicinity.

4. Formation of ultra-thin copper foil: Next, this phosphorus-containing strike plated layer 2A was plated in a solution of:

| | |
|---|---|
| Cu$_2$P$_2$O$_7$.3H$_2$O: | 85 g/liter |
| K$_4$P$_2$O$_7$: | 350 g/liter |
| NH$_3$OH (28%): | 5 ml/liter |
| pH: | 8.5 | under conditions of a current density of 4 A/dm$^2$ so as to form an ultra-thin copper layer 2B and thereby form an ultra-thin copper foil 3 having a total plating thickness tp1 including the thickness of the strike plated layer 2A equal to 3 $\mu$m.

Further, a known method was used to roughen the surface of the ultra-thin copper foil 3 to enable particles of copper to deposit on it. As rust-prevention and surface treatment, the ultra-thin copper layer roughened was then plated by zinc and treated by chromate by a known method to obtain an ultra-thin copper foil with a carrier.

EXAMPLE 2 (FIG. 2)

1. Preparation of carrier copper foil: As the carrier copper foil 1, an untreated electroplated copper foil having a thickness of 31 $\mu$m and a shiny surface roughness Rz of 0.2 $\mu$m was prepared.

2. Formation of peeling layer: The shiny surface of the carrier copper foil 1 was then continuously electrotreated to form a peeling layer 2 comprised of an oxide hydrate film having an amount of deposition of chromium of 0.30 mg/dm$^2$.

3. Formation of phosphorus-containing strike plating layer at surface of peeling layer 2 and its vicinity: Next, this peeling layer 2 was strike plated for 60 seconds in a solution of:

| | |
|---|---|
| Cu$_2$P$_2$O$_7$.3H$_2$O: | 30 g/liter |
| K$_4$P$_2$O$_7$: | 300 g/liter |
| pH: | 8 | under conditions of a current density of 1.5 A/dm$^2$ so as to form a phosphorus-containing layer 2A on the surface of the peeling layer 2 and its vicinity.

4. Formation of ultra-thin copper foil—1: Next, this phosphorus-containing strike plated layer 2A was formed with an ultra-thin copper layer 2C under conditions of:

| | |
|---|---|
| Copper concentration: | 50 g/liter |
| H$_2$SO$_4$: | 100 g/liter |
| Current density: | 15 A/dm$^2$ |

5. Formation of ultra-thin copper foil—2: Next, this was plated in a solution of:

| | |
|---|---|
| Cu$_2$P$_2$O$_7$.3H$_2$O: | 85 g/liter |
| K$_4$P$_2$O$_7$: | 350 g/liter |
| NH$_3$OH (28%): | 5 ml/liter |
| pH: | 8.5 | under conditions of a current density of 4 A/dm$^2$ so as to form an ultra-thin copper layer 2B and thereby form an ultra-thin copper foil 3 having a total plating thickness tp2 including the thicknesses of the strike plated layer 2A and the ultra-thin copper layers 2C and 2B equal to 3 $\mu$m.

Further, a known method was used to roughen the surface of the ultra-thin copper foil 3 to enable particles of copper to deposit on it. As rust-prevention and surface treatment, the ultra-thin copper layer roughened was then plated by zinc and treated by chromate by a known method to obtain an ultra-thin copper foil with a carrier.

EXAMPLE 3 (FIG. 3)

1. Preparation of carrier copper foil: As the carrier copper foil 1, an untreated electroplated copper foil having a thickness of 35 µm and a shiny surface roughness Rz of 0.8 µm was prepared.

2. Formation of peeling layer: The shiny surface of the carrier copper foil 1 was then continuously electrotreated to form a peeling layer 2 comprised of metal chromium and an oxide hydrate film having an amount of deposition of metal of 0.50 mg/dm².

3. Formation of phosphorus-containing layer at surface of peeling layer 2 and its vicinity: Next, this peeling layer 2 was strike plated for 60 seconds in a solution of:

| | |
|---|---|
| $Cu_2P_2O_7 \cdot 3H_2O$: | 16 g/liter |
| $K_4P_2O_7$: | 300 g/liter |
| pH: | 8 | under conditions of a current density of 1.5 A/dm² so as to form a phosphorus-containing layer 2A on the surface of the peeling layer 2 and its vicinity.

4. Formation of ultra-thin copper layer—1: Next, this phosphorus-containing strike plated layer 2A was formed with an ultra-thin copper layer 2C under conditions of:

| | |
|---|---|
| $Cu_2P_2O_7 \cdot 3H_2O$: | 70 g/liter |
| $K_4P_2O_7$: | 250 g/liter |
| $NH_3OH$ (28%): | 4 ml/liter |
| pH: | 8.5 |

5. Formation of ultra-thin foil—2: Next, this phosphorus-containing ultra-thin copper layer 2C was plated in a solution of:

| | |
|---|---|
| Copper concentration: | 55 g/liter |
| $H_2SO_4$: | 80 g/liter | under conditions of a current density of 15 A/dm² to form an ultra-thin copper layer 2B and thereby form an ultra-thin copper foil 3 having a total plating thickness tp2 including the thicknesses of the strike plated layer 2A and the ultra-thin copper layers 2C and 2B equal to 3 µm.

Further, a known method was used to roughen the surface to enable particles of copper to deposit on it. As rust-prevention and surface treatment, the ultra-thin copper layer roughened was then plated by zinc and treated by chromate by a known method to obtain an ultra-thin copper foil with a carrier.

EXAMPLE 4

FIG. 2

Preparation of carrier copper foil: As the carrier copper foil 1, an untreated electroplated copper foil having a thickness of 35 µm and a shiny surface roughness Rz of 4.1 µm was prepared. The peeling layer 2 and the ultra-thin copper 3 were formed under the same conditions as Example 3.

EXAMPLE 5

FIG. 2

1. Preparation of carrier copper foil: As the carrier copper foil 1, an untreated electroplated copper foil having a thickness of 31 µm and a shiny surface roughness Rz of 1.1 µm was prepared.

2. Formation of peeling layer: The shiny surface of the carrier copper foil 1 was then treated by a dip method to form a peeling layer 2 comprised of metal chromium and an oxide hydrate film having an amount of deposition of metal of 0.014 mg/dm².

3. Formation of phosphorus-containing layer at surface of peeling layer 2 and its vicinity: Next, this peeling layer 2 was strike plated for 60 seconds in a solution of:

| | |
|---|---|
| $Cu_2P_2O_7 \cdot 3H_2O$: | 20 g/liter |
| $K_4P_2O_7$: | 300 g/liter |
| pH: | 8 | under conditions of a current density of 1.2 A/dm² so as to form a phosphorus-containing layer 2A on the surface of the peeling layer 2 and its vicinity.

4. Formation of ultra-thin copper foil—1: Next, this phosphorus-containing strike plated layer 2A was formed with an ultra-thin copper layer 2C under conditions of:

| | |
|---|---|
| $Cu_2P_2O_7 \cdot 3H_2O$: | 100 g/liter |
| $K_4P_2O_7$: | 280 g/liter |
| $NH_3OH$ (28%): | 5 ml/liter |
| pH: | 8.5 |

5. Formation of ultra-thin copper foil—2: Next, this phosphorus-containing ultra-thin copper layer 2C was plated in a solution of:

| | |
|---|---|
| CuCN: | 70 g/liter |
| KCN: | 90 g/liter | under conditions of a current density of 5 A/dm² to form an ultra-thin copper layer 2B and thereby form an ultra-thin copper foil 3 having a total plating thickness tp2 including the thicknesses of the strike plated layer 2A and the ultra-thin copper layers 2C and 2B equal to 3 µm.

Further, a known method was used to roughen the surface to enable particles of copper to deposit on it. As rust-prevention and surface treatment, the ultra-thin copper layer roughened was then plated by zinc and treated by chromate by a known method to obtain an ultra-thin copper foil with a carrier.

EXAMPLE 6

FIG. 2

1. Preparation of carrier copper foil: As the carrier copper foil 1, an untreated electroplated copper foil having a thickness of 31 µm and a shiny surface roughness Rz of 4 µm was prepared.

2. Formation of peeling layer: The shiny surface of the carrier copper foil 1 was then continuously electroplated with a nickel-chromium alloy to form a nickel-chromium alloy plating peeling layer 2 having an amount of deposition of 0.50 mg/dm$^2$.

3. Formation of phosphorus-containing layer at surface of peeling layer 2 and its vicinity: Next, this nickel-chromium alloy peeling layer 2 was strike plated for 60 seconds in a solution of:

| | |
|---|---|
| Cu$_2$P$_2$O$_7$.3H$_2$O: | 30 g/liter |
| K$_4$P$_2$O$_7$: | 300 g/liter |
| pH: | 8 | under conditions of a current density of 1.5 A/dm$^2$ so as to form a phosphorus-containing layer 2A on the surface of the peeling layer 2 and its vicinity.

4. Formation of ultra-thin copper foil—1: Next, this phosphorus-containing strike plated layer 2A was formed with a phosphorus-containing ultra-thin copper layer 2C of a thickness of 1 μm by electroplating in a solution of:

| | |
|---|---|
| Cu$_2$P$_2$O$_7$.3H$_2$O: | 90 g/liter |
| K$_4$P$_2$O$_7$: | 300 g/liter |
| pH: | 8 | under conditions of a current density of 4 A/dm$^2$.

5. Formation of ultra-thin foil—2: Next, this phosphorus-containing ultra-thin copper layer 2C was plated in a solution of:

| | |
|---|---|
| Copper concentration: | 50 g/liter |
| H$_2$SO$_4$: | 100 g/liter | under conditions of a current density of 20 A/dm$^2$ to form an ultra-thin copper layer 2B to thereby form an ultra-thin copper foil 3 having a total plating thickness tp2 including the thicknesses of the strike plated layer 2A and the ultra-thin copper layers 2C and 2B equal to 3 μm.

Further, a known method was used to roughen the surface to enable particles of copper to deposit on it. As rust-prevention and surface treatment, the ultra-thin copper layer roughened was then plated by zinc and treated by chromate by a known method to obtain an ultra-thin copper foil with a carrier.

EXAMPLE 7

FIG. 2

1. Preparation of carrier copper foil: As the carrier copper foil 1, an untreated electroplated copper foil having a thickness of 31 μm and a shiny surface roughness Rz of 1.8 μm was prepared.

2. Formation of peeling layer: The shiny surface of the carrier copper foil 1 was then continuously electrotreated to form a metal chromium peeling layer 2 having an amount of deposition of chromium of 1.50 mg/dm$^2$.

3. Formation of phosphorus-containing layer at surface of peeling layer 2 and its vicinity: Next, this peeling layer 2 was strike plated for 2 minutes in a solution of:

| | |
|---|---|
| Cu$_2$P$_2$O$_7$.3H$_2$O: | 30 g/liter |
| K$_4$P$_2$O$_7$: | 300 g/liter |
| pH: | 8 | under conditions of a current density of 1.5 A/dm$^2$ so as to form a phosphorus-containing layer 2A on the surface of the peeling layer 2 and its vicinity.

4. Formation of ultra-thin copper foil—1: Next, this phosphorus-containing strike plated layer 2A was formed with an ultra-thin copper layer 2C under conditions of:

| | |
|---|---|
| CuCN: | 55 g/liter |
| KCN: | 70 g/liter |

5. Formation of ultra-thin copper foil—2: Next, this was plated with an ultra-thin copper layer 2B in a solution of:

| | |
|---|---|
| Cu$_2$P$_2$O$_7$.3H$_2$O: | 85 g/liter |
| K$_4$P$_2$O$_7$: | 350 g/liter |
| NH$_3$OH (28%): | 5 ml/liter |
| pH: | 8.5 | under conditions of a current density of 3 A/dm$^2$ to thereby form an ultra-thin copper foil 3 having a total plating thickness tp2 including the thicknesses of the strike plated layer 2A and the ultra-thin copper layers 2C and 2B equal to 3 μm.

Further, a known method was used to roughen the surface to enable particles of copper to deposit on it. As rust-prevention and surface treatment, the ultra-thin copper layer roughened was then plated by zinc and treated by chromate by a known method to obtain an ultra-thin copper foil with a carrier.

EXAMPLE 8

FIG. 2

1. Preparation of carrier copper foil: As the carrier copper foil 1, an untreated electroplated copper foil having a thickness of 31 μm and a shiny surface roughness Rz of 3.5 μm was prepared.

2. Formation of peeling layer: The shiny surface of the carrier copper foil 1 was then continuously electroplated with an iron-chromium alloy to form an iron-chromium plating peeling layer 2 having an amount of deposition of 1.0 mg/dm$^2$.

3. Formation of phosphorus-containing layer at surface of peeling layer 2 and its vicinity: Next, this iron-chromium peeling layer 2 was strike plated for 1 minute in a solution of:

| | |
|---|---|
| Cu$_2$P$_2$O$_7$.3H$_2$O: | 30 g/liter |
| K$_4$P$_2$O$_7$ : | 300 g/liter |
| pH: | 8 | under conditions of a current density of 1.5 A/dm$^2$ so as to form a phosphorus-containing layer 2A on the surface of the peeling layer 2 and its vicinity.

4. Formation of ultra-thin copper foil—1: Next, this phosphorus-containing strike plated layer 2A was formed with a phosphorus-containing ultra-thin copper layer 2C by electroplating in a solution of:

| | |
|---|---|
| $Cu_2P_2O_7 \cdot 3H_2O$: | 50 g/liter |
| $K_4P_2O_7$: | 300 g/liter |
| pH: | 8 | under conditions of a current density of 4 $A/dm^2$.

5. Formation of ultra-thin copper foil—2: Next, this phosphorus-containing ultra-thin copper layer 2C was plated in a solution of:

| | |
|---|---|
| Copper concentration: | 50 g/liter |
| $H_2SO_4$: | 100 g/liter | under conditions of a current density of 15 $A/dm^2$ to form an ultra-thin copper layer 2B and thereby form an ultra-thin copper foil 3 having a total plating thickness tp2 including the thicknesses of the strike plated layer 2A and the ultra-thin copper layers 2C and 2B equal to 3 $\mu$m.

Further, a known method was used to roughen the surface to enable particles of copper to deposit on it. As rust-prevention and surface treatment, the ultra-thin copper layer roughened was then plated by zinc and treated by chromate by a known method to obtain an ultra-thin copper foil with a carrier.

EXAMPLE 9

FIG. 1

1. Preparation of carrier copper foil: As the carrier copper foil 1, an untreated electroplated copper foil having a thickness of 31 $\mu$m and a shiny surface roughness Rz of 1.0 $\mu$m was prepared.

2. Formation of peeling layer: The shiny surface of the carrier copper foil 1 was then continuously electrotreated to form a peeling layer 2 comprised of metallic chromium and an oxide hydrate film having an amount of deposition of metal of 0.50 $mg/dm^2$.

3. Formation of strike plated layer at surface of peeling layer: This was then plated in a bath of a copper cyanate strike plating bath composition of:

| | |
|---|---|
| CuCN: | 30 g/liter |
| KCN: | 40 g/liter |
| pH: | 11.5 | for 1.5 minutes at a current density of 4 $A/dm^2$ so as to form a strike plating layer 2A.

4. Formation of ultra-thin copper foil: Next, this strike plated layer 2A was formed with an ultra-thin copper layer 2B by plating in a solution of:

| | |
|---|---|
| CuCN: | 70 g/liter |
| KCN: | 90 g/liter | under conditions of a current density of 5 $A/dm^2$ to thereby form an ultra-thin copper foil 3 having a total plating thickness tp1 including the thicknesses of the strike plated layer 2A and the ultra-thin copper layer 2B equal to 3 $\mu$m.

Further, a known method was used to roughen the surface to enable particles of copper to deposit on it. As rust-prevention and surface treatment, the ultra-thin copper layer roughened was then plated by zinc and treated by chromate by a known method to obtain an ultra-thin copper foil with a carrier.

EXAMPLE 10

FIG. 3A

The ultra-thin copper foil with a carrier produced in Example 1 was coated on its surface with a resin varnish using a roll coater to a thickness of 6.0 $mg/dm^2$, then was heat treated at a temperature of 160° C. for 5 minutes to obtain an insulating resin layer 4 of the B stage. The carrier foil 1 was peeled off to form a resin-coated copper foil. This resin-coated copper foil was used to make a printed circuit board. The varnish used was prepared by mixing 130 parts by weight of Epicron 1121-75M (product name, bisphenol A type epoxy resin varnish made by Dainippon Ink & Chemicals), 2.1 parts by weight of dicyan diamide, 0.1 part by weight of 2-ethyl-4-methylimidazole, and 20 parts by weight of methyl cellusolve.

COMPARATIVE EXAMPLE 1

An ultra-thin copper foil with a carrier was prepared without strike plating with pyrophosphoric acid in the state of Example 3.

COMPARATIVE EXAMPLE 2

An ultra-thin copper foil with a carrier was prepared without strike plating with pyrophosphoric acid in the state of Example 3 but changing the carrier foil to one with a surface roughness Rz of 4.1 $\mu$m.

Samples for evaluation of the carrier peel strength and pinholes of the foils shown in the examples were prepared and evaluated as follows:

(1) Preparation of One-Sided Copper-Clad Laminate for Measurement of Carrier Peel Strength The ultra-thin copper foil with a carrier copper foil (Examples 1 to 10 and Comparative Examples 1 and 2) was cut to 250 mm×250 mm, then the ultra-thin copper foil 3 was covered on its surface (surface of roughened surface side) by a glass fiber reinforced epoxy prepreg sheet (FR-4) giving a thickness after hot bonding of 1 mm, the assembly was sandwiched between two flat stainless steel plates, then the assembly was hot bonded at a temperature of 170° C. and a pressure of 50 $kg/cm^2$ for 60 minutes to produce a one-sided copper-clad FR-4 laminate with a carrier foil for the test of carrier peel strength.

Further, the ultra-thin copper foil with a carrier copper foil (Examples 1 to 10 and Comparative Examples 1 and 2) was cut to 250 mm×250 mm, then the ultra-thin copper foil 3 was covered on its surface (surface of roughened surface side) by a polyimide sheet of a thickness of 50 $\mu$m (UPILEX-VT made by Ube Industry), the assembly was sandwiched between two flat stainless steel plates, then the assembly was hot bonded at a temperature of 330° C. and a pressure of 2 $kg/cm^2$ for 10 minutes by a 20 torr (2666.4 Pa) vacuum press, then was hot bonded at a temperature of 330° C. and a pressure of 50 $kg/cm^2$ for 5 minutes to thereby produce a one-sided copper-clad polyimide laminate with a carrier foil for the test of carrier peel strength.

(2) Preparation of One-Sided Copper-Clad Laminate for Measurement of Pinholes

A one-sided copper-clad laminate for measurement of pinholes was prepared by the same steps as the FR-4 one-sided copper-clad laminate for the measurement of carrier peel strength.

Evaluation of Properties (1) Measurement of Carrier Peel Strength

Figure 3A:
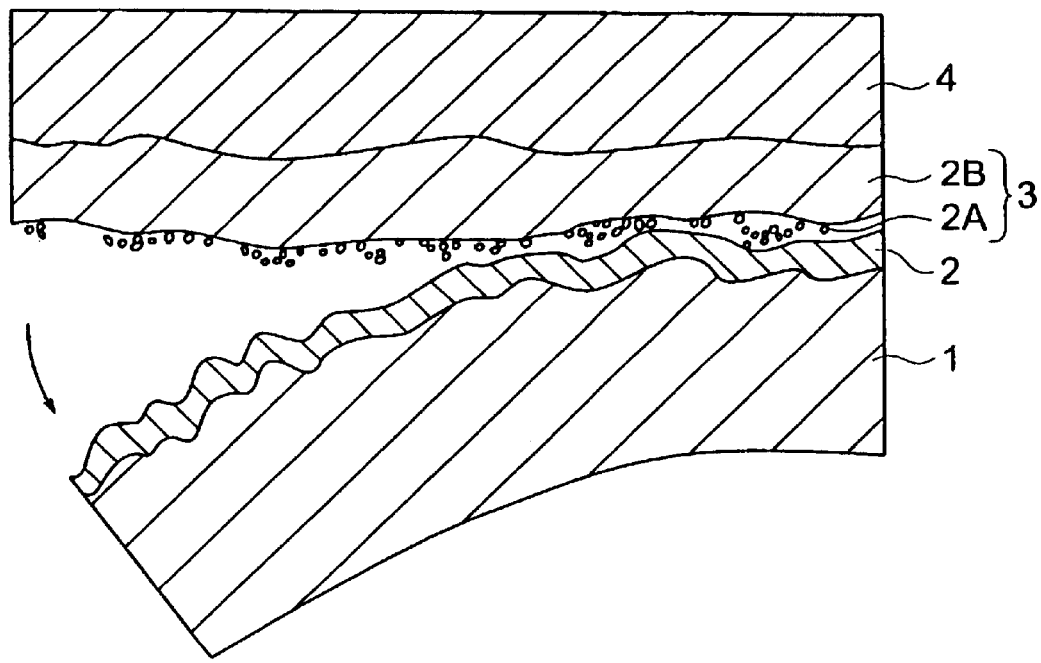
FIG. 3A is a cross-sectional view of the structure of a printed circuit board using a copper foil with a carrier shown in FIG. 1.
Figure 3B:
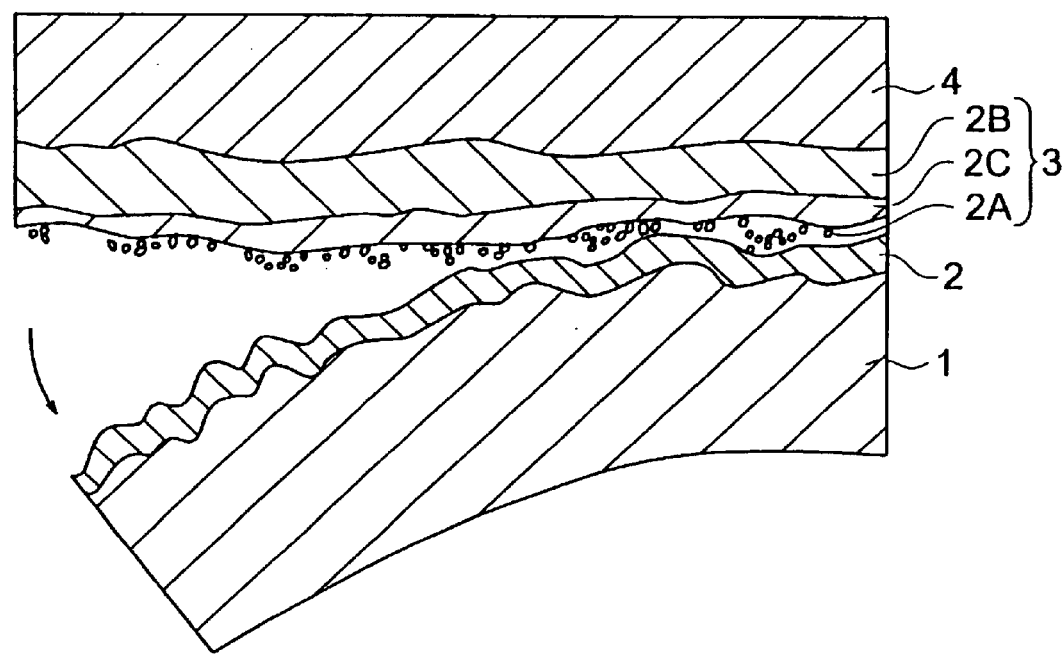
FIG. 3B is a cross-sectional view of the structure of a printed circuit board using a copper foil with a carrier shown in FIG. 2.
Figure 4:
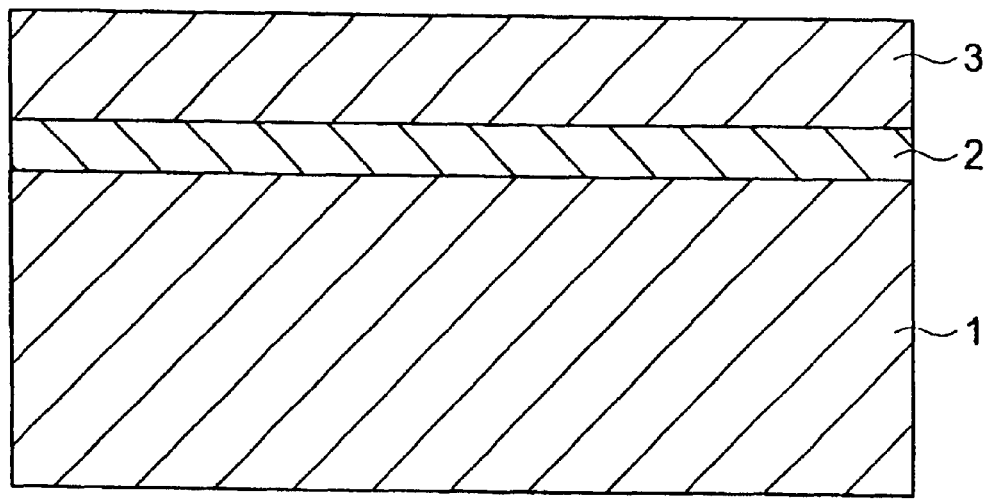
FIG. 4 is a cross-sectional view of an embodiment of a conventional copper foil with a carrier.

A sample is cut out from a one-sided copper-clad laminate with a carrier copper foil prepared by the method of the above (1), the carrier copper foil is peeled off from the resin layer 4 by a measurement sample width of 10 mm as shown in FIG. 3A and FIG. 3B and the peel strength was measured by an n of 3 in accordance with the method defined in JIS C 6511. The evaluation results are shown in Table 1.

(2) Measurement of Pinholes

A 250 mm×250 mm one-sided copper-clad laminate prepared by the method of (2) was illuminated with light from the resin board side in a dark room and the number of pinholes was counted by the light passing through it. The results of evaluation are shown together in Table 1.

Figure 2:
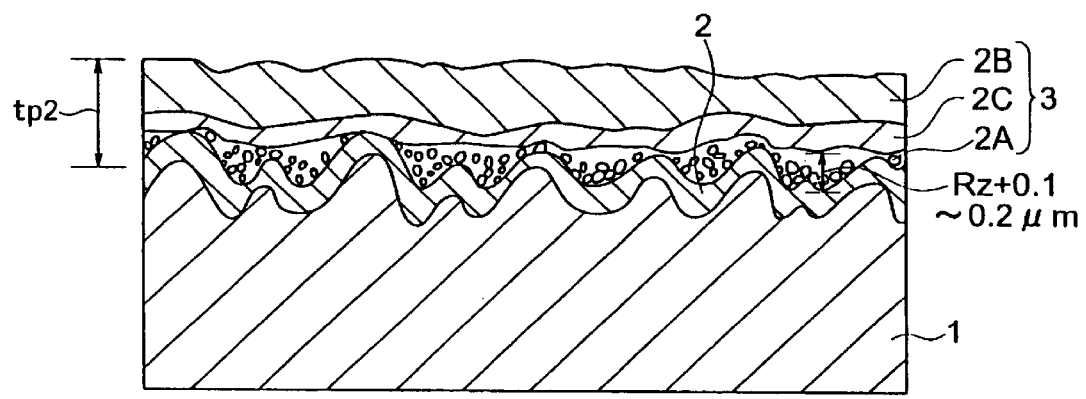
FIG. 2 is a cross-sectional view of another example of the structure of a copper foil with a carrier.

(3) Method of measurement of area ratio of copper plating on peeling layer at position of surface roughness Rz of ultra-thin copper foil plus 0.1 to 0.2 μm at ultra-thin copper foil side from projections of surface relief at carrier foil side of ultra-thin copper foil The peeling layer provided on the surface of the carrier foil under the plating conditions of Examples 1 to 10 and Comparative Examples 1 and 2, as shown in FIG. 1 and FIG. 2, was plated by copper up to a position of the surface roughness Rz of the ultra-thin copper foil plus 0.1 to 0.2 μm at the ultra-thin copper foil side from the projections of the surface relief of the carrier foil side of the ultra-thin copper foil, a transparent tape was adhered to the surface to adhere the copper side to the transparent tape, then the tape was peeled off. The surface area of the peeling layer and the surface area of the peeled off copper layer were measured and the ratio calculated. The results are shown together in Table 1.

For confirmation, it is possible to bury the copper foil in a resin and polish and measure the ultra-thin copper foil side from the projections of the surface relief of the carrier foil side of the ultra-thin copper foil up to a position of the surface roughness Rz of the ultra-thin copper foil plus 0.1 to 0.2 μm. Further, it is also possible to slice and confirm copper foil buried in a resin by a focused ion beam (FIB) etc.

(4) Method of measurement of conductivity of copper plating on peeling layer between the position of surface roughness Rz of ultra-thin copper foil plus 0.2 μm at ultra-thin copper foil side and the projections of surface relief at carrier foil side of ultra-thin copper foil.

The peeling layer provided on the surface of the carrier foil under the plating conditions of the examples and comparative examples was plated by copper to a position of the Rz value +0.2 μm from the recesses of the surface relief of the peeling layer, transparent tape was adhered to the surface to adhere the copper side to the transparent tape, then was peeled off. The conductivity of the copper layer stuck to the tape was measured. The results are also given in Table 1. For confirmation, it is possible to polish or chemically dissolve up to the roughness Rz value +0.1 to 0.2 μm of the surface of the ultra-thin copper foil from the projections of the surface relief of the ultra-thin copper foil formed on the surface of the peeling layer of the carrier foil surface from the carrier foil side of the ultra-thin copper foil, measure the conductivity before and after polishing or dissolution, and find the conductivity from the difference. This method is an effective means in the case of a resin-coated copper foil.

TABLE 1

| | FR-4 carrier peel strength (KN/m) | PI carrier peel strength (KN/m) | Pinholes | Ratio of area of copper to surface area of peeling layer (%) | Conductivity (%) |
|---|---|---|---|---|---|
| Ex. 1 | 0.018 | 0.038 | 5 | 95 | 93 |
| | 0.017 | 0.031 | | | |
| | 0.015 | 0.025 | | | |
| Ex. 2 | 0.016 | 0.032 | 1 | 98 | 98 |
| | 0.017 | 0.023 | | | |
| | 0.014 | 0.025 | | | |
| Ex. 3 | 0.015 | 0.030 | 0 | 97 | 99 |
| | 0.018 | 0.022 | | | |
| | 0.019 | 0.027 | | | |
| Ex. 4 | 0.021 | 0.035 | 2 | 93 | 97.5 |
| | 0.019 | 0.032 | | | |
| | 0.023 | 0.029 | | | |
| Ex. 5 | 0.019 | 0.022 | 3 | 96 | 96.2 |
| | 0.017 | 0.025 | | | |
| | 0.018 | 0.029 | | | |
| Ex. 6 | 0.015 | 0.021 | 4 | 92 | 98 |
| | 0.016 | 0.024 | | | |
| | 0.017 | 0.023 | | | |
| Ex. 7 | 0.015 | 0.029 | 0 | 95 | 99 |
| | 0.016 | 0.039 | | | |
| | 0.017 | 0.031 | | | |
| Ex. 8 | 0.025 | 0.046 | 1 | 93 | 98.3 |
| | 0.024 | 0.042 | | | |
| | 0.028 | 0.043 | | | |
| Ex. 9 | 0.025 | 0.032 | 2 | 98 | 97.8 |
| | 0.022 | 0.042 | | | |
| | 0.028 | 0.027 | | | |
| Comp. Ex. 1 | 0.037 | Not measurable | 22 | 75 | 82.1 |
| | 0.025 | | | | |
| | 0.019 | | | | |
| Comp. Ex. 2 | 0.031 | 0.087 | 87 | 65 | 73.4 |
| | 0.021 | 0.035 | | | |
| | 0.019 | 0.072 | | | |

Evaluation Results (1) Carrier Peel Strength

In the case of an FR-4 carrier peel strength, even with a hot bonding temperature of 170° C., the carrier peel strength of the samples of the comparative examples were somewhat large in value, while the samples of the examples of the invention were stable and low in carrier peel strength. Further, in the case of a polyimide carrier peel strength, the hot bonding temperature was a high temperature of 330° C., so peeling was not possible in Comparative Example 1 and peeling was possible in Comparative Example 2, but peeling was difficult because of more than 0.05 KN/m, while peeling was possible in all of the samples of the examples of the invention and the lowest value was exhibited in the sample of Example 5.

(2) Pinholes

Comparative Example 1 exhibited numerous pinholes, while the samples of the examples of the invention were confirmed to have less pinholes. Further, Comparative Example 2 exhibited the greatest number of pinholes. In the examples of the invention, electroplated copper foil was used as the carrier foil, but similar effects are obtained even if using as the carrier foil an electrolytic copper alloy foil, rolled copper (alloy) foil, aluminum foil, aluminum alloy foil, stainless steel foil, titanium foil, or titanium alloy foil. Further, the ultra-thin copper layer was formed after the strike plating in a copper sulfate bath or copper pyrophosphate plating bath, but it may also be formed in a copper sulfamate bath, copper borofluoride plating bath, etc.

(3) Measurement of Area Ratio

The area ratio of the copper layer and peeling layer at a position of a surface roughness Rz value +0.2 μm of the ultra-thin copper foil at the carrier foil side from the projections of the surface relief of the ultra-thin copper foil was at least 90% copper layer in the examples of the invention. It is understood that the copper layer enters the relief of the peeling layer, the peeling layer and copper layer come into uniform close contact, the peeling layer is protected by the copper layer, deterioration of the peeling layer is prevented, and the peel strength is stabilized by prevention of deterioration of the peeling layer. On the other hand, in the comparative examples, the area ratio is a low one of less than 75%. This shows that in the comparative examples, the copper layer does not enter into the relief of the peeling layer and the peeling layer and copper layer are in a peeled apart state. It is believed that at the time of plating of the copper layer, the peeling layer is deteriorated by the plating bath and that as a result, the peel strength is not stabilized.

(4) Measurement of Conductivity

The conductivity at a position of a surface roughness Rz value of the ultra-thin copper foil +0.2 μm at the carrier foil side from the projections of the surface relief of the ultra-thin copper foil was more than 90% in all of the examples of the invention, but was less than 90% in the copper foil of the comparative examples. From these results, it is understood that in the examples of the invention, despite the difficult-to-plate peeling layer having a relief surface, the copper layer comes into uniform close contact with the relief surface and plating is performed without destroying the peeling layer, so the peel strength can be stabilized. On the other hand, in the comparative examples as well, the difficult-to-plate peeling layer has a relief surface and surface treatment is performed as usual, so the copper layer does not come into uniform close contact with the relief surface and the space ratio between the peeling layer and surface of the copper layer becomes large. It is believed that at the time of plating of the copper layer, the peeling layer is deteriorated by the plating bath and that as a result, the peel strength is not stabilized.

(5) Approach to Fine Patterns of Printed Circuit Board

High density ultrafine interconnects were formed on a printed circuit board prepared in Example 10 with line widths and line pitches of 30 μm, whereby interconnects of fine patterns with no disconnects or short-circuits can be realized.

Further, by using an ultra-thin copper foil with a carrier prepared in the above examples and laminating it on a board 4 made of a polyimide resin by hot bonding at a high temperature of 350° C., it was possible to easily peel off the ultra-thin copper foil bonded on the board 4 from the carrier copper foil 1 bonded with the peeling layer 2. Next, by forming through holes in the surface of the ultra-thin copper foil 3 and plating the through holes, etching the ultra-thin copper foil 3 to form interconnect patterns provided with the desired line widths and line pitches, and finally forming a solder resist and performing other finishing work to complete a printed circuit board, it was possible to prepare interconnects at a fine pitch without any disconnection due to etching.

With the carrier-coated ultra-thin foil and method of production of the same according to the present invention, it is possible to produce foil without detracting from the peelability at the peeling layer 2 and easily peel it off from the carrier foil 1 and the peeling layer 2 even when bonded with a resin board at a high temperature. Further the plating on the peeling layer 2 has been considered difficult to make uniform due to its peelability, but uniform copper plating is possible by utilizing strike plating and therefore an ultra-thin copper foil with a carrier with few pinholes can be produced. Further, user needs have been able to be dealt with by inserting a diffusion prevention layer to enable peeling even in processing at a high temperature of the related art, but there was the difficulty that the nickel, nickel-cobalt, etc. of the diffusion prevention layer was extremely poor in etchability and remarkably reduced the productivity of the user. The ultra-thin copper foil with a carrier of the present invention satisfies user needs since peeling is possible without forming a diffusion prevention layer.

Summarizing the effects of the invention, the invention provides an ultra-thin copper foil with a carrier, and a method of production of the same, which enables foil to be easily peeled off even in high temperature bonding which had been impossible in the past without providing a diffusion-prevention layer and which enables a reduction of the number of pinholes. The foil can therefore satisfy user needs and production costs can be reduced by stabilizing the quality of the product.

While the invention has been described with reference to specific embodiments chosen for purpose of illustration, it should be apparent that numerous modifications could be made thereto by those skilled in the art without departing from the basic concept and scope of the invention.

What is claimed is:

1. An ultra-thin copper foil with a carrier comprised of a carrier foil, a peeling layer, and an ultra-thin copper layer, wherein said ultra-thin copper layer and said peeling layer are provided between them with a strike plating layer and wherein said ultra-thin copper layer and said strike plating layer are one of a phosphorus-containing copper layer and a phosphorus-containing copper alloy layer and wherein said peeling layer and said strike plating layer are composed of materials that are distinct and different from each other.

2. An ultra-thin copper foil with a carrier comprised of a carrier foil, a peeling layer, and an ultra-thin copper layer, wherein said ultra-thin copper layer and said peeling layer are provided between them with a strike plating layer comprised of one of a phosphorus-containing copper layer and a phosphorus-containing copper alloy layer, said strike plating layer is provided thereon with a copper plating ultra-thin layer, and said ultra-thin layer is provided thereon with said ultra-thin copper layer comprised of one of copper and a copper alloy and wherein said peeling layer and said strike plating layer are composed of materials that are distinct and different from each other.

3. An ultra-thin copper foil with a carrier comprised of a carrier foil, a peeling layer, and an ultra-thin copper layer, wherein said ultra-thin copper layer and said peeling layer are provided between them with a strike plating layer comprised of one of a phosphorus-containing copper layer and a phosphorus-containing copper alloy layer, said strike plating layer is provided thereon with a copper plating ultra-thin layer, and said ultra-thin layer is provided thereon with said ultra-thin copper layer comprised of one of a phosphorus-containing copper layer and a phosphorus-containing copper alloy layer and wherein said peeling layer and said strike plating layer are composed of materials that are distinct and different from each other.

4. An ultra-thin copper foil with a carrier comprised of a carrier foil, a peeling layer, and an ultra-thin copper layer, wherein said ultra-thin copper layer and said peeling layer are provided between them with a strike plating layer comprised of one of a phosphorus-containing copper layer and a phosphorus-containing copper alloy layer, said strike plating layer is provided thereon with an ultra-thin layer comprised of one of a phosphorus-containing copper layer and phosphorus-containing copper alloy layer, and the ultra-thin layer is provided thereon with said ultra-thin copper layer comprised of one of copper and a copper alloy and wherein said peeling layer and said strike plating layer are composed of materials that are distinct and different from each other.

5. An ultra-thin copper foil with a carrier comprised of a carrier foil, a peeling layer, and an ultra-thin copper layer, wherein said ultra-thin copper layer and said peeling layer are provided between them with a strike plating layer comprised of one of a phosphorus-containing copper layer and a phosphorus-containing copper alloy layer, said strike plating layer is provided thereon with an ultra-thin layer comprised of one of a phosphorus-containing copper layer and phosphorus-containing copper alloy layer, and the ultra-thin layer is provided thereon with said ultra-thin copper layer comprised of one of a phosphorus-containing copper and a phosphorus-containing copper alloy and wherein said peeling layer and said strike plating layer are composed of materials that are distinct and different from each other.

6. An ultra-thin copper foil with a carrier comprised of a carrier foil, a peeling layer provided on the carrier foil, and an ultra-thin copper layer provided on the peeling layer, wherein a surface roughness Rz of a surface of the carrier foil facing the ultra-thin copper layer is in a range of 0.1 $\mu$m to 5 $\mu$m, a surface roughness Rz of a surface of the ultra-thin copper layer facing the carrier foil is in a range of 0.1 $\mu$m to 5 $\mu$m, and wherein there is disposed between said peeling layer and said ultra-thin copper layer a copper or copper alloy layer covering at least 90% of a surface of the peeling layer facing the ultra-thin copper layer at a position approximately 0.1 $\mu$m to 0.2 $\mu$m away from an average height of projections extending from a surface relief of a surface of the peeling layer facing the ultra-thin copper layer and a peel strength after hot bonding of at least 300° C. is 0.01 KN/m to 0.05 KN/m.

7. An ultra-thin copper foil with a carrier comprised of a carrier foil, a peeling layer provided on the carrier foil, and an ultra-thin copper layer provided on the peeling layer, wherein a surface roughness Rz of a surface of the carrier foil facing the ultra-thin copper layer is in a range of 0.1 $\mu$m to 5 $\mu$m, a surface roughness Rz of a surface of the ultra-thin copper layer facing the carrier foil is in a range of 0.1 $\mu$m to 5 $\mu$m, and wherein there is disposed between said peeling layer and said ultra-thin copper layer a copper or copper alloy layer having a conductivity of at least 90% formed on a surface of the peeling layer facing the ultra-thin copper layer at a position approximately 0.1 $\mu$m to 0.2 $\mu$m away from an average height of projections extending from a surface relief of a surface of the peeling layer facing the ultra-thin copper layer, and a peel strength after hot bonding of at least 300° C. is 0.01 KN/m to 0.05 KN/m.

8. An ultra-thin copper foil with a carrier as set forth in any one of claims 1 to 5, wherein a surface roughness Rz of the a surface of the carrier foil facing the ultra-thin copper layer is in a range of 0.1 $\mu$m to 5 $\mu$m and wherein a peel strength after hot bonding of at least 300° C. is 0.01 KN/m to 0.05 KN/m.

9. An ultra-thin copper foil with a carrier as set forth in any one of claims 1 to 5, wherein a surface roughness Rz of a surface of the carrier foil facing the ultra-thin copper layer is in a range of 0.1 $\mu$m to 5 $\mu$m, a surface roughness Rz of a surface of the ultra-thin copper layer facing the carrier foil is in a range of 0.1 $\mu$m to 5 $\mu$m, and wherein there is disposed between said peeling layer and said ultra-thin copper layer a copper or copper alloy layer covering at least 90% of a surface of the peeling layer facing the ultra-thin copper layer at a position approximately 0.1 $\mu$m to 0.2 $\mu$m away from an average height of projections extending from a surface relief of a surface of the peeling layer facing the ultra-thin copper layer, and a peel strength after hot bonding of at least 300° C. is 0.01 KN/m to 0.05 KN/m.

10. An ultra-thin copper foil with a carrier as set forth in any one of claims 1 to 5, wherein a surface roughness Rz of a surface of the carrier foil facing the ultra-thin copper layer is in a range of 0.1 $\mu$m to 5 $\mu$m, a surface roughness Rz of a surface of the ultra-thin copper layer facing the carrier foil is in a range of 0.1 $\mu$m to 5 $\mu$m, and wherein there is disposed between said peeling layer and said ultra-thin copper layer a copper or copper alloy layer having a conductivity of at least 90% formed on the surface of the peeling layer facing the ultra-thin copper layer at a position approximately 0.1 $\mu$m to 0.2 $\mu$m away from an average height of projections extending from a surface relief of a surface of the peeling layer facing the ultra-thin copper layer, and a peel strength after hot bonding of at least 300° C. is 0.01 KN/m to 0.05 KN/m.

11. An ultra-thin copper foil with a carrier as set forth in any one of claims 1 to 7, wherein said peeling layer is one of a chromium metal and chromium alloy.

12. An ultra-thin copper foil with a carrier as set forth in any one of claims 1 to 7, wherein said peeling layer is one of an oxide hydrate of a chromium metal and chromium alloy.

13. An ultra-thin copper foil with a carrier as set forth in any one of claims 1 to 7, wherein said peeling layer is formed by one of a chromium metal, chromium alloy, and oxide hydrate of one of a chromium metal and chromium alloy.

14. An ultra-thin copper foil with a carrier as set forth in claim 11, wherein the amount of deposited metal of one of a chromium metal and chromium alloy of the peeling layer is not more than 4.5 mg/dm$^2$.

15. An ultra-thin copper foil with a carrier as set forth in claim 12, wherein the amount of deposited metal of one of a chromium metal and chromium alloy in the peeling layer comprised of an oxide hydrate is not more than 0.015 mg/dm$^2$.

16. An ultra-thin copper foil with a carrier as set forth in claim 13, wherein the amount of deposited metal of one of a chromium metal and chromium alloy of the peeling layer is not more than 4.5 mg/dm$^2$.

17. An ultra-thin copper foil with a carrier as set forth in any one of claims 1 to 7, wherein said peeling layer is one of nickel, iron, an alloy of the same, and an oxide hydrate containing the same.

18. A printed circuit board wherein an ultra-thin copper foil with a carrier as set forth in any one of claims 1 to 7 is used to form high density ultrafine interconnects.

19. A printed circuit board wherein an ultra-thin copper foil with a carrier as set forth in claim 8 is used to form high density ultrafine interconnects.

20. A printed circuit board wherein an ultra-thin copper foil with a carrier as set forth in claim 9 is used to form high density ultrafine interconnects.

21. A printed circuit board wherein an ultra-thin copper foil with a carrier as set forth in claim 10 is used to form high density ultrafine interconnects.

* * * * *